United States Patent
Moon et al.

(10) Patent No.: US 11,211,102 B2
(45) Date of Patent: *Dec. 28, 2021

(54) METHOD AND MEMORY SYSTEM FOR OPTIMIZING ON-DIE TERMINATION SETTINGS OF MULTI-RANKS IN A MULTI-RANK MEMORY DEVICE

(71) Applicant: SAMSUNG ELECTRONICS CO., LTD., Suwon-si (KR)

(72) Inventors: Dae-Sik Moon, Suwon-si (KR); Kyung-Soo Ha, Hwaseong-si (KR); Young-Soo Sohn, Seoul (KR); Ki-Seok Oh, Seoul (KR); Chang-Kyo Lee, Seoul (KR); Jin-Hoon Jang, Uiwang-si (KR); Yeon-Kyu Choi, Seoul (KR); Seok-Hun Hyun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/104,114

(22) Filed: Nov. 25, 2020

(65) Prior Publication Data

US 2021/0082479 A1 Mar. 18, 2021

Related U.S. Application Data

(63) Continuation of application No. 16/363,077, filed on Mar. 25, 2019, now Pat. No. 10,885,950.

(30) Foreign Application Priority Data

Mar. 27, 2018 (KR) .................. 10-2018-0035367
Oct. 31, 2018 (KR) .................. 10-2018-0132555

(51) Int. Cl.
*G11C 7/10* (2006.01)
*G11C 7/22* (2006.01)

(52) U.S. Cl.
CPC .......... *G11C 7/1048* (2013.01); *G11C 7/1084* (2013.01); *G11C 7/222* (2013.01)

(58) Field of Classification Search
CPC ...... G11C 7/1048; G11C 7/1084; G11C 7/222
(Continued)

(56) References Cited

U.S. PATENT DOCUMENTS 8,619,492 B2 12/2013 Jeon
9,099,165 B1 8/2015 Lee
(Continued)

FOREIGN PATENT DOCUMENTS

KR 1020170008861 1/2017
KR 1020170037705 4/2017
KR 10-1789077 10/2017

*Primary Examiner* — Connie C Yoha
(74) *Attorney, Agent, or Firm* — F. Chau & Associates, LLC

(57) ABSTRACT

A method of operating memory devices disposed in different ranks of a multi-rank memory device and sharing a signal line includes receiving, in all of the memory devices included in the multi-rank memory device, on-die termination (ODT) state information of the signal line. The method further includes storing, in each of the memory devices of the multi-rank memory device, the ODT state information of the signal line in a mode register. The method further includes generating, in each of the memory devices of the multi-rank memory device, a control signal based on the ODT state information of the signal line stored in the mode register. The method further includes changing, in each of the memory devices of the multi-rank memory device, an ODT setting of the signal line in response to the control signal.

20 Claims, 15 Drawing Sheets

(58) Field of Classification Search
USPC .......................... 365/189.05, 230.03, 189.08
See application file for complete search history.

(56) References Cited

U.S. PATENT DOCUMENTS

| | | |
|---|---|---|
| 9,780,782 B2 | 10/2017 | Bains et al. |
| 9,812,220 B2 | 11/2017 | Kim et al. |
| 9,922,724 B2 | 3/2018 | Kim et al. |
| 10,566,038 B2 * | 2/2020 | Son .......................... G11C 7/24 |
| 10,885,950 B2 * | 1/2021 | Moon .................. G11C 11/4093 |
| 10,923,175 B2 * | 2/2021 | Moon ................... G11C 11/409 |
| 2006/0129712 A1 | 6/2006 | Raghuram |
| 2012/0257459 A1 | 10/2012 | Berke |
| 2012/0326746 A1 | 12/2012 | McCall et al. |
| 2013/0222009 A1 | 8/2013 | Kang |
| 2014/0002131 A1 | 1/2014 | Shaeffer |
| 2014/0028345 A1 | 1/2014 | Oh et al. |
| 2015/0089127 A1 | 3/2015 | Bains et al. |
| 2016/0134285 A1 | 5/2016 | Ha |
| 2017/0329719 A1 | 11/2017 | Hampel et al. |
| 2019/0259429 A1 | 8/2019 | Heo et al. |
| 2019/0304517 A1 | 10/2019 | Moon et al. |

* cited by examiner

FIG. 4

| MODE REGISTER (310) ||
|---|---|
| OP0 | CK PAIR ODT STATES OF MULTI-RANKS |
| 0 | ALL RANKS SHARING CK PAIR ARE UN-TERMINATED (DEFAULT) |
| 1 | ONE OF RANKS SHARING CK PAIR ARE TERMINATED |

FIG. 5

| MODE REGISTER (310) ||
|---|---|
| OP1 | CA INPUTS ODT STATES OF MULTI-RANKS |
| 0 | ALL RANKS SHARING CA INPUTS ARE UN-TERMINATED (DEFAULT) |
| 1 | ONE OF RANKS SHARING CA INPUTS ARE TERMINATED |

METHOD AND MEMORY SYSTEM FOR OPTIMIZING ON-DIE TERMINATION SETTINGS OF MULTI-RANKS IN A MULTI-RANK MEMORY DEVICE

CROSS-REFERENCE TO RELATED APPLICATIONS

This application is a continuation application of U.S. patent application Ser. No. 16/363,077 filed Mar. 25, 2019, which claims priority under 35 U.S.C. § 119 to Korean Patent Application Nos. 10-2018-0035367 and 10-2018-0132555, respectively filed on Mar. 27, 2018 and Oct. 31, 2018 in the Korean Intellectual Property Office, the disclosures of which are incorporated by reference herein in their entireties.

TECHNICAL FIELD

Exemplary embodiments of the inventive concept relate to a memory system, and more particularly, to a method of optimizing on-die termination (ODT) settings of signal lines in the memory system according to ODT state information of the signal lines shared by multi-ranks in a multi-rank memory system.

DISCUSSION OF THE RELATED ART

Mobile memory devices, such as low power double data rate (LPDDR) synchronous dynamic random-access memory (SDRAM), are used in mobile electronic devices such as, for example, smartphones, tablet personal computers, laptop personal computers, etc. As the capacity of mobile operating systems increases to support multi-tasking operations performed by the mobile electronic devices, mobile electronic devices having lower power consumption characteristics and high operating performance are desired.

In multi-rank memory systems, multi-ranks include a number of memory devices which receive and respond to all common commands from a memory controller. The common commands are transmitted to a pin (or pins), which are shared by the multi-rank memory devices. Each of the multi-rank memory devices receives a common command through an on-die termination (ODT) setting of a signal line(s) to which the shared pin(s) is connected.

However, each of the multi-rank memory devices may not determine how the ODT setting of the signal line(s) shared with other memory devices connected to the shared signal line(s) is provided. For example, an ODT setting environment of the shared signal line(s) of the multi-ranks is not known to the memory devices. The multi-rank memory devices receive the common commands via the signal line(s), and thus, the sensitivity of input buffers of the multi-rank memory devices may be different and power consumption may be different, depending on the ODT setting environment of the shared signal line(s). Characteristic deviations between the memory devices may degrade the performance of the multi-rank memory system.

SUMMARY

Exemplary embodiments of the inventive concept provide a method and memory system for optimizing on-die termination (ODT) settings of memory devices according to ODT state information through broadcasting the ODT state information of signal lines shared by multi-ranks to the memory devices.

According to an exemplary embodiment of the inventive concept, a method of operating memory devices disposed in different ranks of a multi-rank memory device and sharing a signal line includes receiving, in all of the memory devices included in the multi-rank memory device, on-die termination (ODT) state information of the signal line. The method further includes storing, in each of the memory devices of the multi-rank memory device, the ODT state information of the signal line in a mode register. The method further includes generating, in each of the memory devices of the multi-rank memory device, a control signal based on the ODT state information of the signal line stored in the mode register. The method further includes changing, in each of the memory devices of the multi-rank memory device, an ODT setting of the signal line in response to the control signal.

According to an exemplary embodiment of the inventive concept, a memory device included in one rank of a multi-rank memory device includes a signal line shared by the memory device and by another memory device included in another rank of the multi-rank memory device, a mode register configured to store on-die termination (ODT) state information of the signal line shared by the memory device and the another memory device, an ODT circuit connected to the signal line, and a control circuit configured to generate a control signal based on the ODT state information stored in the mode register and selectively turn on/off the ODT circuit in response to the control signal.

According to an exemplary embodiment of the inventive concept, a method of operating a memory controller configured to control operations of multi-ranks included in a multi-rank memory device and sharing a signal line, includes receiving a memory request for memory access to the multi-ranks, identifying one of the multi-ranks as a target rank to which a data process operation is to be performed according to the memory request, and determining whether all of the multi-ranks sharing the signal line are to be operated in an un-terminated on-die termination (ODT) state. The method further includes determining, based on the target rank, which multi-rank sharing the signal line is to be operated in a terminated ODT state upon determining that all of the multi-ranks are not to be operated in the un-terminated ODT state. The method further includes broadcasting ODT state information of the signal line shared by the multi-ranks to all memory devices included in the multi-ranks. The ODT state information indicates which of the multi-ranks is to be operated in the un-terminated ODT state and which of the multi-ranks is to be operated in the terminated ODT state. The method further includes controlling, in each of the memory devices of the multi-ranks, an ODT setting based on the ODT state information.

According to an exemplary embodiment of the inventive concept, a memory controller configured to control operations of multi-ranks included in a multi-rank memory device and sharing signals includes a processor and an on-die termination (ODT) control logic. The processor is configured to receive a memory request for memory access to the multi-ranks, and identify one of the multi-ranks as a target rank for performing a data processing operation according to the memory request. The ODT control logic is configured to broadcast ODT state information of a signal line shared by the multi-ranks to all memory devices of the multi-ranks, and change an ODT setting of at least one of the memory devices of the multi-ranks based on the ODT state information.

BRIEF DESCRIPTION OF THE DRAWINGS

The above and other features of the inventive concept will become more apparent by describing in detail exemplary embodiments thereof with reference to the accompanying drawings, in which:

FIGS. 3 through 5 are diagrams illustrating a memory device in FIG. 1.

DETAILED DESCRIPTION OF THE EXEMPLARY EMBODIMENTS

Figure 1:
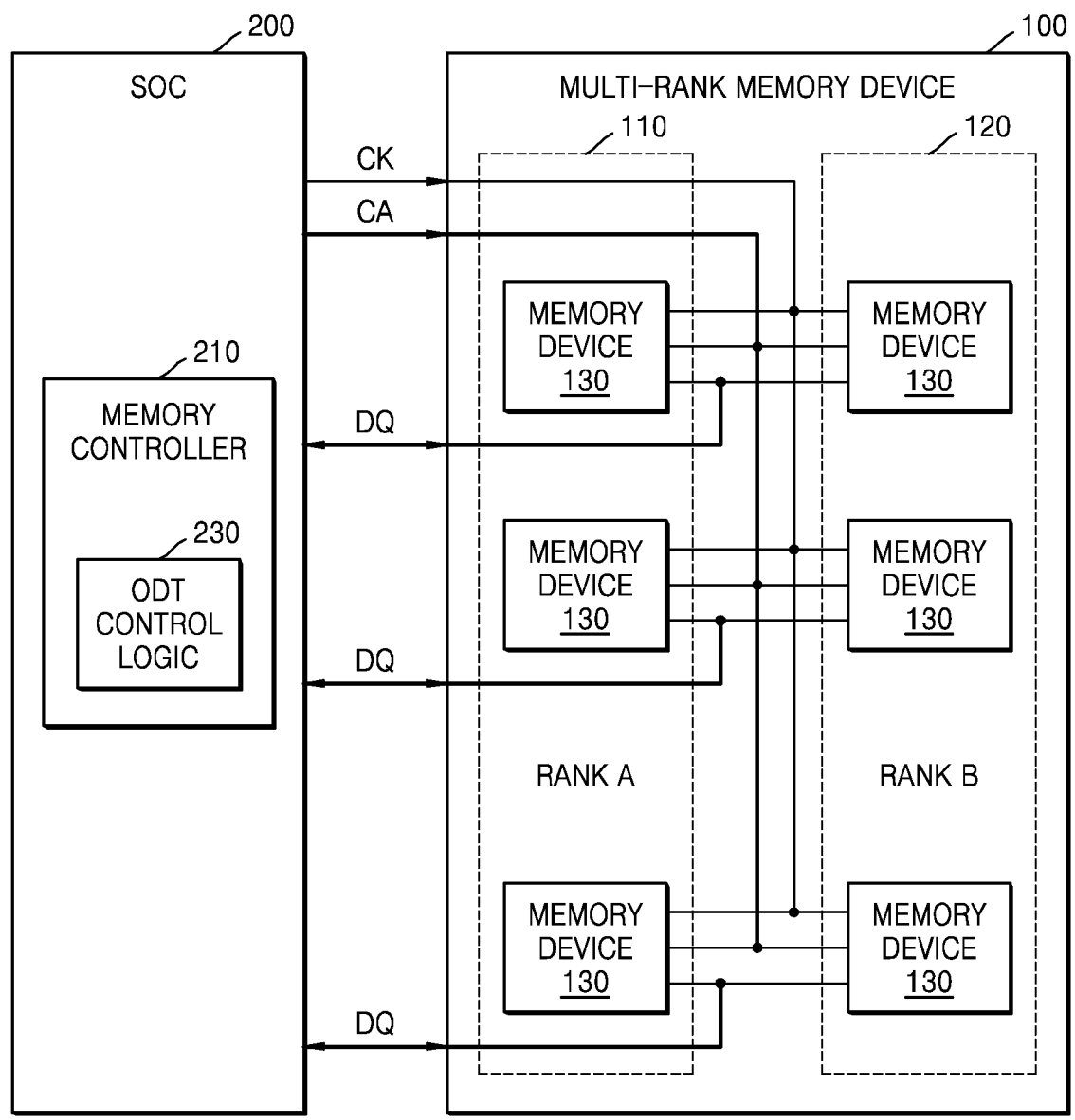
FIG. 1 is a block diagram illustrating a memory system according to an exemplary embodiment.

Exemplary embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

FIG. 1 is a block diagram illustrating a memory system 10 according to an exemplary embodiment.

Referring to FIG. 1, the memory system 10 may include a multi-rank memory device 100 and a system on a chip (SOC) 200. The memory system 10 may be implemented in, for example, a personal computer (PC) or a mobile electronic device. The mobile electronic device may be, for example, a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a hand-held game console, a mobile Internet device (MID), a wearable computer, an Internet of things (IoT) device, an Internet of everything (IoE) device, or a drone.

The multi-rank memory device 100 may include multi-ranks (for example, a rank A 110 and a rank B 120) to facilitate simultaneous access to a large number of bits. The rank A 110 and the rank B 120 may each include a plurality of memory devices 130 in parallel. The rank A 110 and the rank B 120 may share data DQ pins, command/address CA pins, and clock CK pins. The rank A 110 and the rank B 120 may each have one or more particular enable signals to select a rank among different ranks. For example, the rank A 110 and the rank B 120 may each use select/enable signals such as a chip select (CS) signal and a clock enable (CKE) signal to distinguish itself from other ranks. The memory devices 130 of the same rank may share the same select/enable signals. For example, the memory devices 130 of the rank A 110 may share the same select/enable signals, and the memory devices 130 of the rank B 120 may share the same select/enable signals.

In an exemplary embodiment according to FIG. 1, the multi-rank memory device 100 may include memory devices 130 of at least two ranks (for example, the rank A 110 and the rank B 120). Even though the memory system 10 illustrated in FIG. 1 has a two-rank structure, which divides the memory system 10 into a target rank and a non-target rank, exemplary embodiments are not limited thereto, and may have various ranks structures. For example, the memory system 10 may have various rank structures such as a four rank structure.

The SOC 200 may represent a host controller of the memory system 10. The SOC 200 may be implemented as, for example, an application processor (AP), a mobile AP, a chipset, or a collection of chips. The SOC 200 may include one or more processors including a single and/or multi-core processor. The SOC 200 may include one or more memory controllers 210 that control the memory devices 130 of the multi-rank memory device 100. According to an exemplary embodiment, the memory system 10 may include discrete processors and memory controller components other than the SOC 200. According to an exemplary embodiment, the memory controller 210 may be implemented as a physical device which is separate from a package including a processor(s) and cache components. According to an exemplary embodiment, the memory controller 210 may be a part of the processor, for example, a circuit of the processor. According to an exemplary embodiment, the memory controller 210 may be implemented in logic of the SOC 200 which is shared by a plurality of processor devices.

The SOC 200 and/or the memory controller 210 of the memory system 10, which are hereinafter collectively referred to as the memory controller 210, may include connectors to connect the multi-rank memory device 100 to the memory devices 130 of the multi-rank memory device 100. The connectors may be implemented as, for example, pins, balls, signal lines, or other hardware components.

The memory system 10 may apply an on-die termination (ODT) setting to preserve signal quality of the target rank among the multi-ranks (for example, the rank A 110 and the rank B 120). All of the memory devices 130 in the rank A 110 and the rank B 120 may share ODT states of the rank A 110 and the rank B 120. The memory controller 210 may include an ODT control logic 230 (also referred to as an ODT control logic circuit) to allow all of the memory devices 130 to share the ODT states of the rank A 110 and the rank B 120. The ODT control logic 230 may simultaneously transmit the ODT states of the rank A 110 and the rank B 120 to the memory devices 130. Hereinafter, ODT signaling for simultaneously transmitting the ODT states of the rank A 110 and the rank B 120 to the memory devices 130 of the rank A 110 and the rank B 120 may be referred to as broadcasting.

Figure 2:
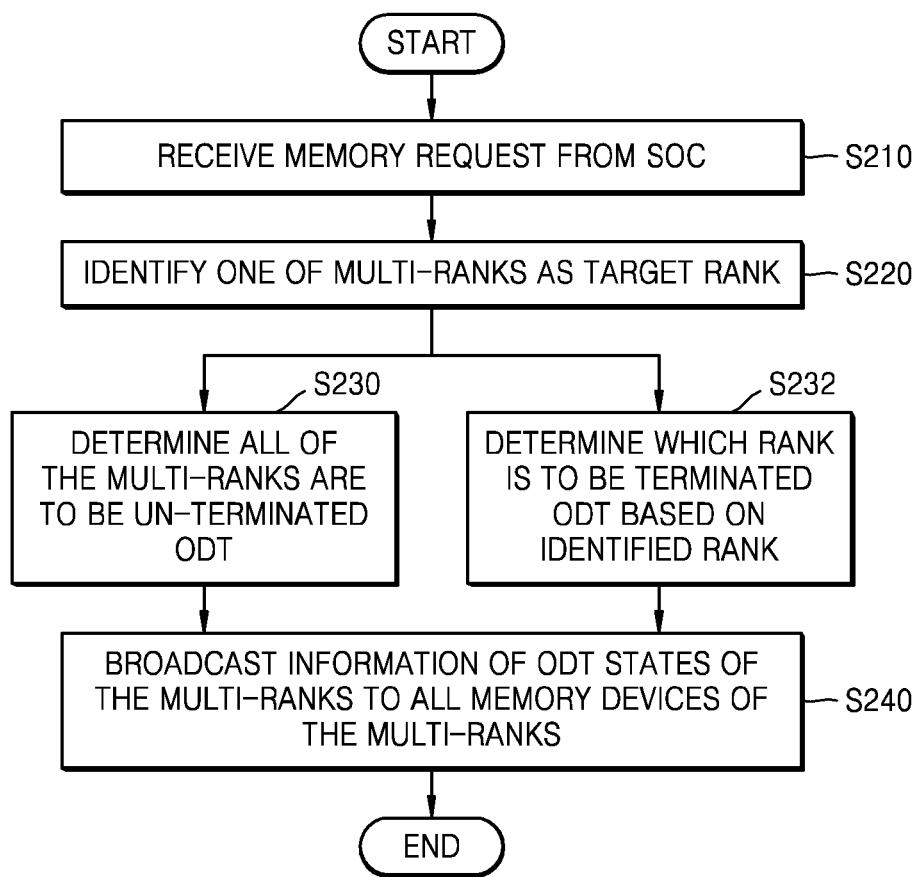
FIG. 2 is a flowchart of a method of operating a memory controller in FIG. 1.

FIG. 2 is a flowchart of a method of operating the memory controller 210 in FIG. 1.

Referring to FIG. 2, the memory controller 210 may receive, from the processor of the SOC 200, a memory request for memory access to the rank A 110 and the rank B 120 (S210). The memory request may include write/read requests. The memory controller 210 may control data processing operations (for example, write or read operations) to be performed by the rank A 110 and the rank B 120 according to the memory request.

The memory controller 210 may identify one of the ranks (for example, the rank A 110 or the rank B 120) as the target rank for performing the data processing operation according to the memory request (S220). The memory controller 210 may identify the target rank based on how the data DQ is mapped onto memory cell arrays of the memory devices 130.

In operations S230 and S232, it is determined whether all of the ranks are to be operated in an un-terminated ODT state (S230), or otherwise, which rank is to be operated in a terminated ODT state (S232).

For example, referring to operation S230, it is determined whether any of the ranks (for example, the rank A 110 and the rank B 120) are to be operated in an un-terminated ODT state. For example, the memory controller 210 may determine that all of the ranks (for example, the rank A 110 and the rank B 120) are to be operated in an un-terminated ODT state. For example, in this case, the memory controller 210 may determine not to apply the ODT of the signal line(s) connected to the clock CK pin and/or the command/address CA pins, which are shared by the rank A 110 and the rank B 120. The memory controller 210 may set the un-terminated ODT state of all of the ranks (for example, the rank A 110 and the rank B 120) as a default state.

Referring to operation S232, the memory controller 210 may determine which rank is to be operated in a terminated ODT state based on a rank that has been identified as the target rank among all of the ranks (for example, the rank A 110 and the rank B 120).

For example, the memory controller 210 may follow a guide or rule to ensure that the target rank applies the ODT for the write operation. The memory controller 210 may determine which resistance value of the ODT is to be applied to the target rank. The memory controller 210 may determine, in the target rank, the resistance value of the ODT of the signal line(s) connected to the clock CK pin and/or the command/address CA pins, which are shared by the rank A 110 and the rank B 120. For example, the resistance value of the ODT of the target rank may be set to an intrinsic value of a termination resistor Rt (see FIG. 6B).

The memory controller 210 may broadcast ODT state information indicating the ODT status of the ranks determined in operations S230 and S232 in operation S240. For example, the memory controller may broadcast ODT state information of the rank A 110 and the rank B 120 that has been determined in operation S230 or operation S232 to all of the memory devices 130 of the rank A 110 and the rank B 120 (S240).

For example, the memory controller 210 may use a mode register set (MRS) command to broadcast the ODT state information of the rank A 110 and the rank B 120 to all of the memory devices 130 of the rank A 110 and the rank B 120. In exemplary embodiments, the ODT state information may be received by all of the memory devices 130 via a shared signal line. In exemplary embodiments, the ODT state information may indicate whether all of the memory devices 130 connected to the shared signal line are to be operated in an un-terminated ODT state. In exemplary embodiments, when the ODT state information indicates that not all of the memory devices 130 are to be operated in an un-terminated ODT state, the ODT state information may indicate which of the memory devices 130 connected to the shared signal line is to be operated in a terminated ODT state. The MRS command may refer to a command for direct programming of a mode register 310 (see FIG. 3) capable of setting various functions, characteristics, and modes of the memory devices 130. The memory controller 210 may broadcast the ODT state information of the rank A 110 and the rank B 120 as an appropriate bit value(s) that is provided to a command/address bus 304 (see FIG. 3) of the memory device 130 when the MRS command is issued. The mode register 310 of the memory device 130 may store the ODT state information of the rank A 110 and the rank B 120.

Figure 3:
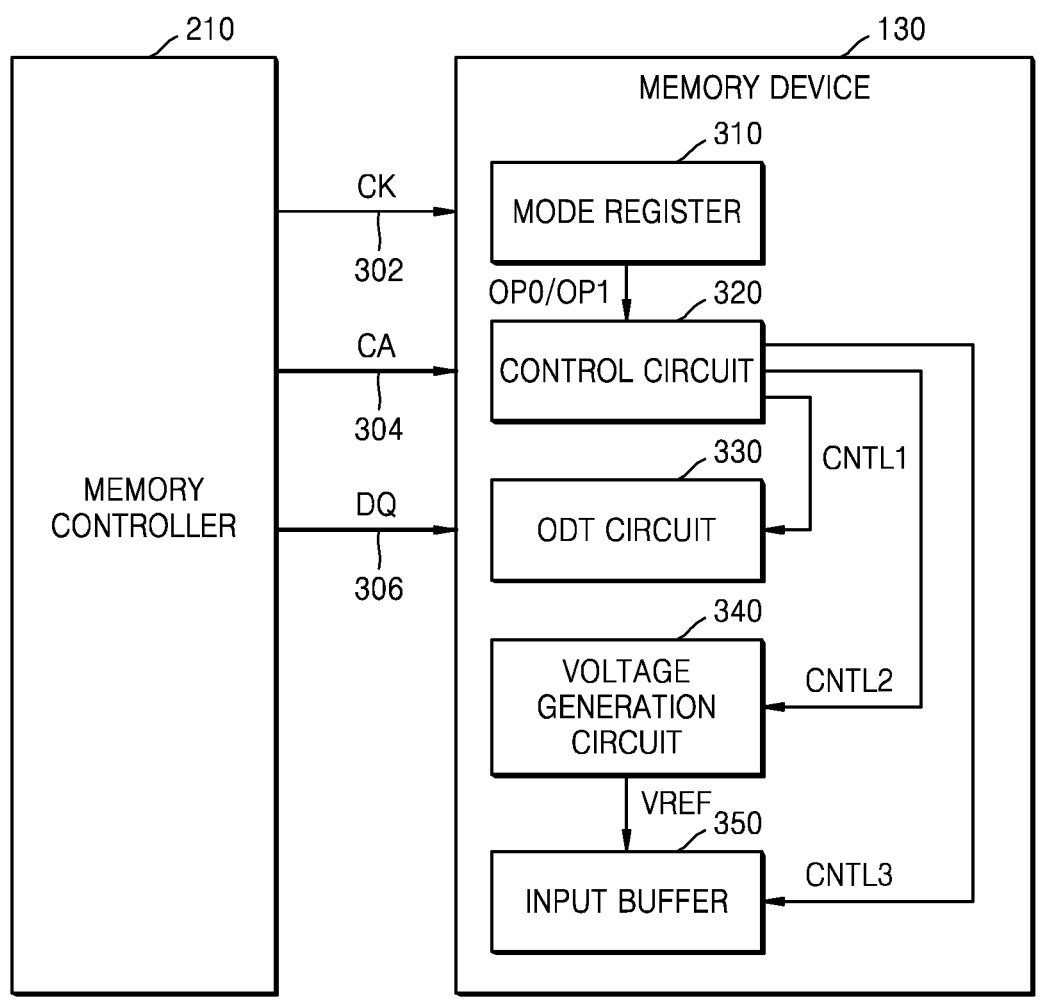

FIGS. 3 through 5 are diagrams illustrating one of the memory devices 130 in FIG. 1.

The memory device 130 in FIG. 3 may represent any one of the memory devices 130 of the rank A 110 and the rank B 120 in FIG. 1. For example, it is to be understood that the description of the memory device 130 in FIG. 3 applies to all of the memory devices 130 in FIG. 1. FIGS. 4 and 5 show exemplary embodiments of the mode register 310 of the memory device 130.

Referring to FIG. 3, the memory device 130 may be connected to the memory controller 210 via a clock signal line 302, a command/address bus 304, and a data bus 306.

The clock CK signal generated by the memory controller 210 may be provided to the memory device 130 via the clock signal line 302. For example, the clock CK signal may be provided as a continuous alternating inverted signal together with an inverted clock (CKB) signal. A clock signal pair (CK and CKB) may detect rising/falling edges with reference to their crossing points, and thus, may improve timing accuracy. The clock signal line 302 may transmit, by using the clock signal pair (CK and CKB), continuous alternating inverted signals that are complementary to each other. In this case, the clock signal line 302 may include two signal lines for transmitting the clock CK signal and the inverted clock CKB signal. The clock CK signal described in the exemplary embodiments of the inventive concept may be described as the clock signal pair (CK and CKB). For convenience of explanation, the clock signal pair (CK and CKB) may be collectively referred to as the clock CK signal.

Commands issued by the memory controller 210 may be provided to the memory device 130 via the command/address bus 304. In addition, an address signal issued by the memory controller 210 may be provided to the memory device 130 via the command/address bus 304. A command signal or the address signal may be issued by a combination of the command/address CA signals received in a time series via the command/address bus 304.

For data interface between the memory controller 210 and the memory device 130, data DQ may be transmitted via the data bus 306. For example, write data DQ provided by the memory controller 210 may be transmitted to the memory device 130 via the data bus 306, and read data DQ read from the memory device 130 may be transmitted to the memory controller 210 via the data bus 306.

The memory device 130 may include the mode register 310, a control circuit 320, an ODT circuit 330, a voltage generation circuit 340, and an input buffer 350.

The mode register 310 may program functions, characteristics, and/or modes of the memory device 130. The mode register 310 may be programmed with user defined variables by the MRS command. The mode register 310 may be divided into various fields according to the functions, characteristics, and/or modes. Since all registers of the mode register 310 do not have defined default values, the contents of the mode register 310 may be initialized. For example, after a power-up and/or a reset for a correct operation, the contents of the mode register 310 may be programmed. In addition, the contents of the mode register 310 may be changed due to re-execution of the MRS command during a normal operation. Accordingly, the functions, characteristics, and/or modes of the memory device 130 may be updated.

For example, the mode register 310 may store data for controlling a burst length (BL), a read burst type (RBT), a column address strobe (CAS) latency (CL), a test mode, a delay-locked loop (DLL) reset, a DLL enable/disable, an output drive intensity, an additive latency (AL), an output buffer enable/disable, a cascade latency, a power down mode, a data mask function, a write data bus inversion (DBI) function, a read DBI function, etc.

The mode register 310 may store the ODT state information of the rank A 110 and the rank B 120 broadcasted by the memory controller 210. The mode register 310 may store the ODT state information of the rank A 110 and the rank B 120 provided as an appropriate bit value(s) via the command/address bus 304.

The mode register 310 of FIG. 4 shows a register or storage area OP0 that is used to program the ODT state information of the clock signal pair (CK and CKB) shared by the rank A 110 and the rank B 120. The mode register 310 may store the ODT state of the clock signal pair (CK and CKB) based on an OP0 setting. The mode register 310 may, based on the OP0 setting, show whether all of the ranks (for example, the rank A 110 and the rank B 120) sharing the clock signal pair (CK and CKB) are in the un-terminated ODT state, or whether any one of the ranks (for example, the rank A 110 or the rank B 120) is in the terminated ODT state.

The mode register 310 of FIG. 5 shows a register or storage area OP1 that is used to program the ODT state information of the command/address CA signal inputs shared by the rank A 110 and the rank B 120. The mode register 310 may store the ODT state of the command/address CA signal inputs based on the OP1 setting. The mode register 310 may, based on the OP1 setting, show whether all of the ranks (for example, the rank A 110 and the rank B 120) sharing the command/address CA signal inputs are in the un-terminated ODT state, or whether any one of the ranks (for example, rank A 110 or the rank B 120) is in the terminated ODT state.

The control circuit 320 may, based on the ODT state information stored in the mode register 310, generate first through third control signals CNTL1 through CNTL3. The control circuit 320 may provide the first control signal CNTL1 to the ODT circuit 330 to control the ODT circuit 330 to be selectively turned on/off. In exemplary embodiments, turning the ODT circuit 330 on/off changes the ODT state of the corresponding memory device 130. The control circuit 320 may provide the second control signal CNTL2 to the voltage generation circuit 340 to control a level of a reference voltage VREF to be changed. The control circuit 320 may provide the third control signal CNTL3 to the input buffer 350 to control a type of the input buffer 350 to be changed.

The ODT circuit 330 may determine how to apply the ODT settings on the clock signal line 302, the command/address bus 304, and/or the data bus 306. For example, The ODT circuit 330 may be terminated to a ground voltage VSS via the termination resistor Rt in response to the first control signal CNTL1 provided from the control circuit 320.

The voltage generation circuit 340 may generate various kinds of voltages for performing the write and read operations of the memory device 130. The voltage generation circuit 340 may generate the reference voltage VREF provided to the input buffer 350.

The input buffer 350 may receive signals transmitted to the clock signal line 302 and/or the command/address bus 304. The input buffer 350 may, based on the reference voltage VREF, receive the clock signal pair (CK and CKB) transmitted to the clock signal line 302 or the command/address CA signal transmitted to the command/address bus 304.

Figure 6A:
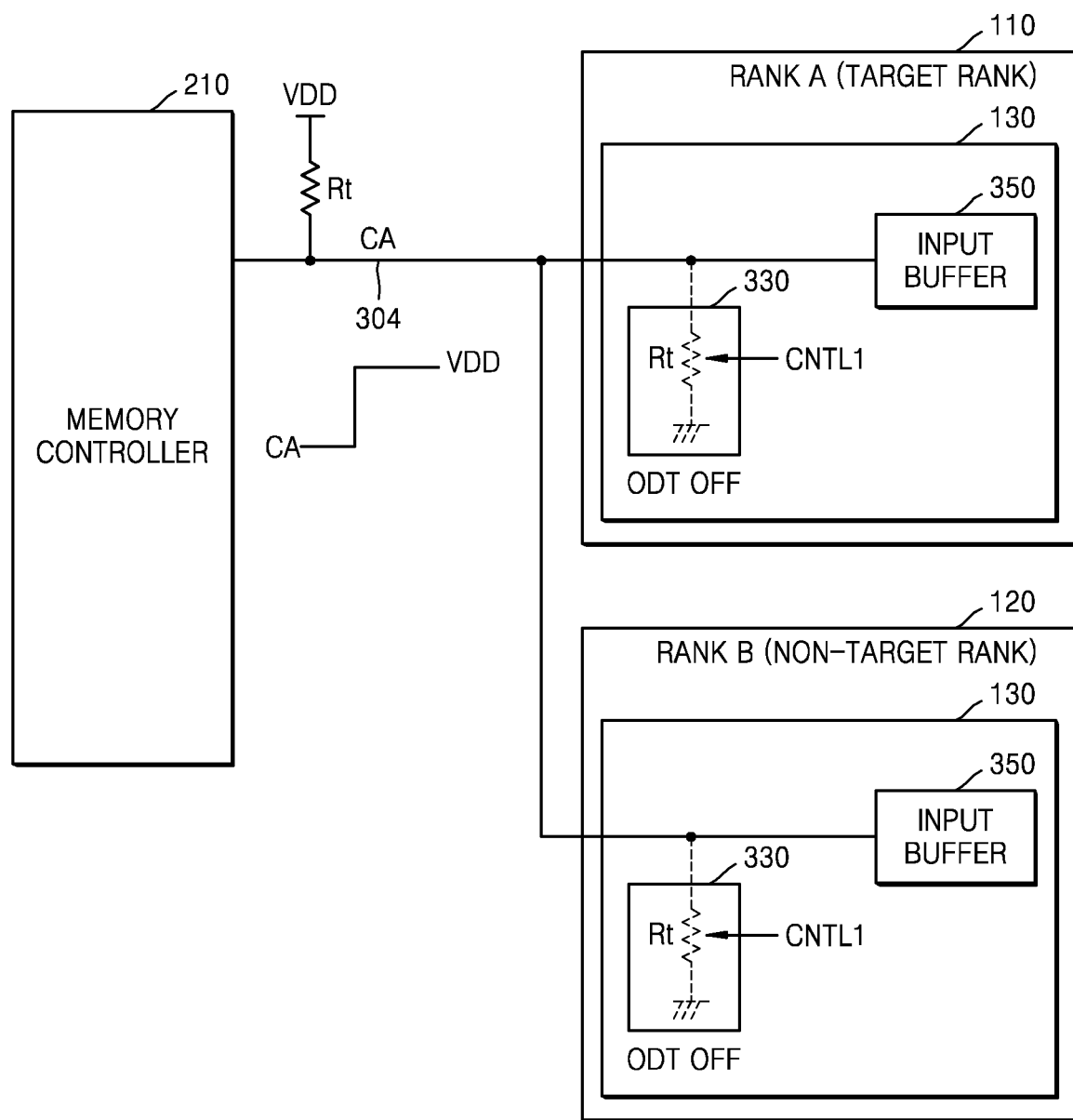
FIGS. 6A through 6C are diagrams illustrating on-die termination (ODT) operations of a memory device in FIG. 3, respectively.
Figure 6B:
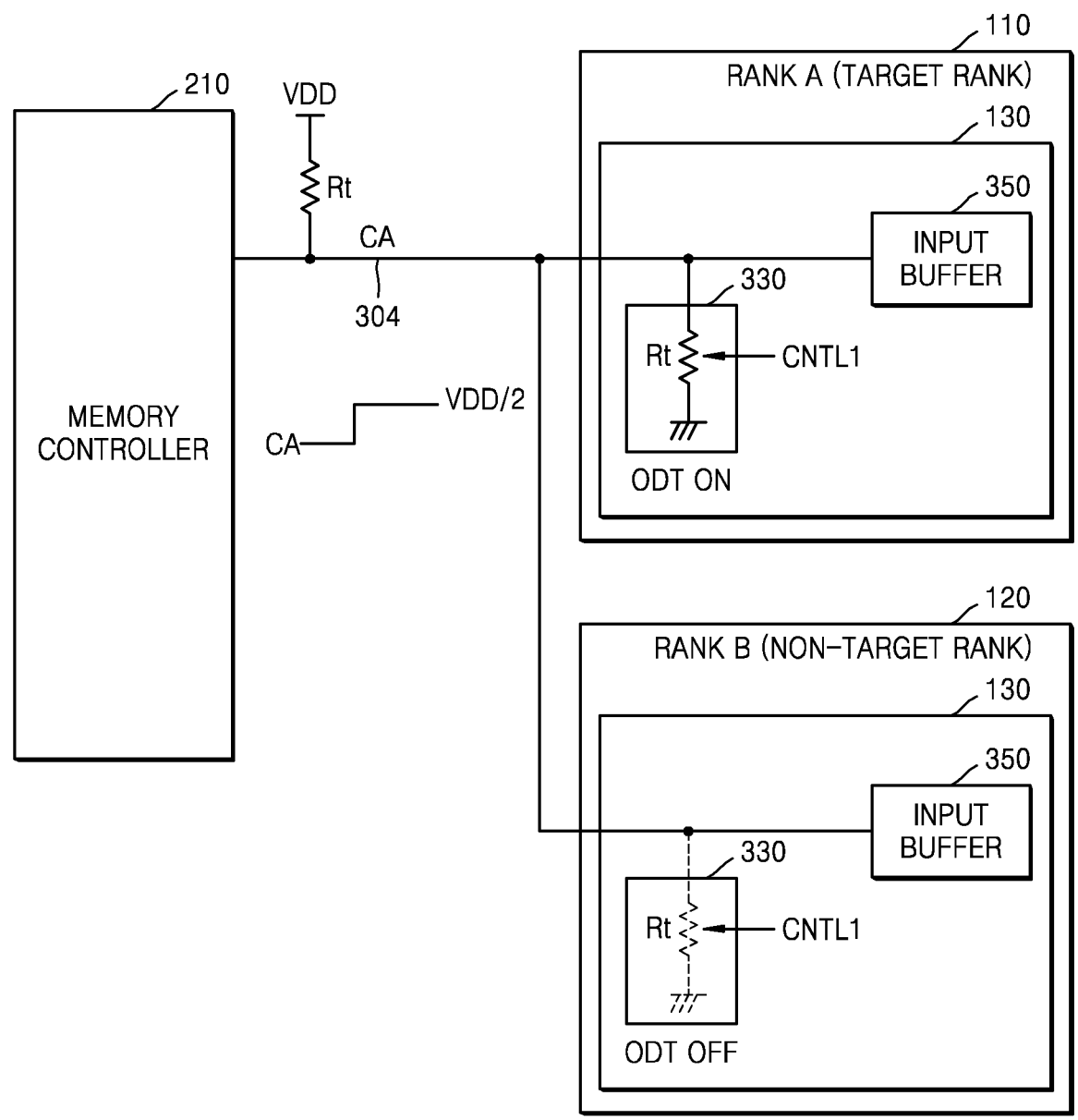
Figure 6C:
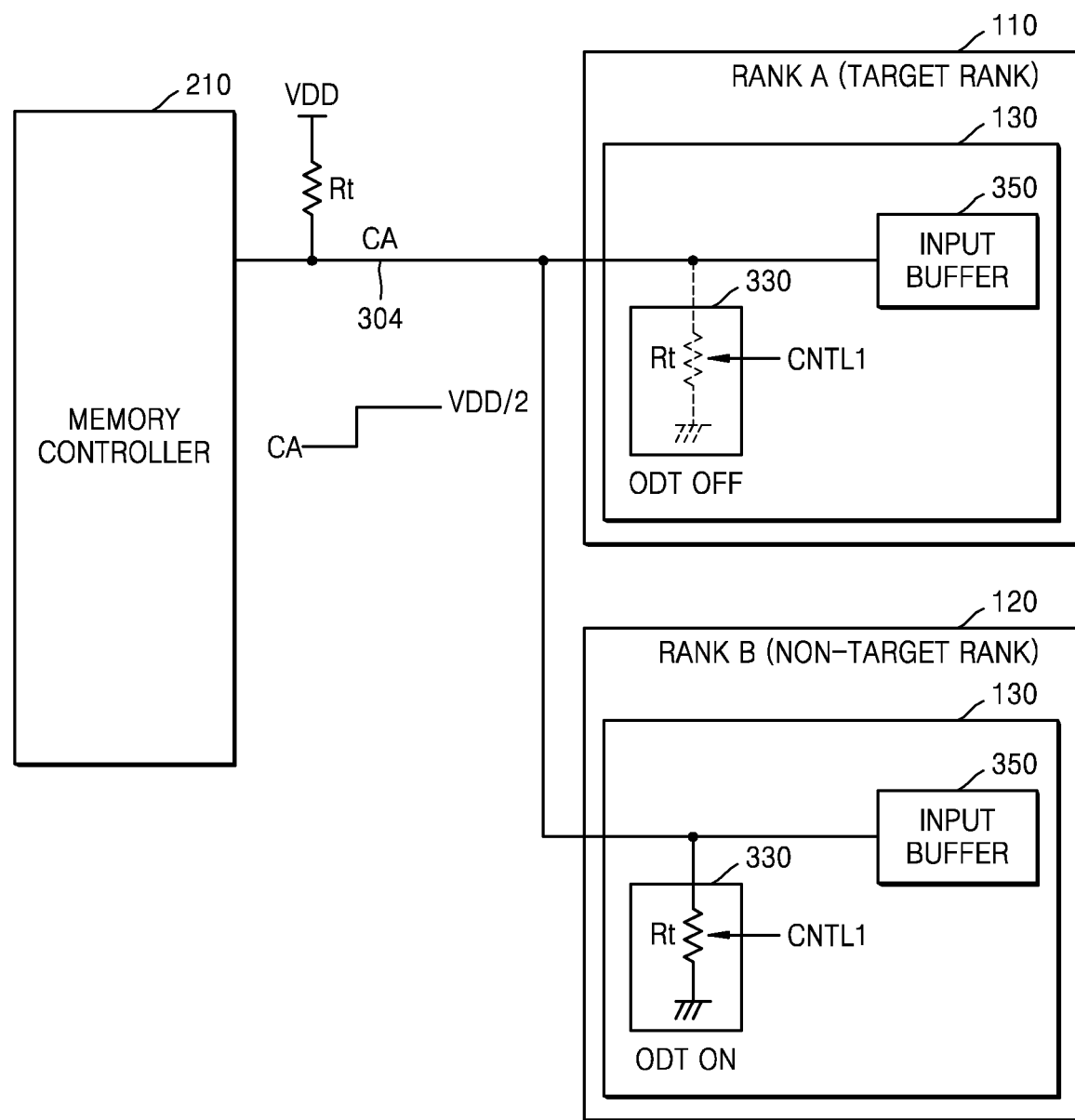

FIGS. 6A through 6C are diagrams illustrating ODT operations of the memory device 130 in FIG. 3, respectively.

FIGS. 6A through 6C illustrate the ODT circuit 330, which is selectively turned on/off according to the ODT state of the command/address CA signal inputs, which are shared by the rank A 110 and the rank B 120 in FIG. 1 and stored in the mode register 310 of FIG. 5, respectively. In FIGS. 6A through 6C, the rank A 110 and the rank B 120 may be divided into the target rank and the non-target rank. That is, in FIGS. 6A through 6C, the rank A 110 is the target rank and the rank B 120 is the non-target rank. Operations according to the ODT state of the command/address CA signal inputs described in FIGS. 6A through 6C may be the same as those according to the ODT state information of the clock signal pair (CK and CKB), which is shared by the rank A 110 and the rank B 120 and stored in the mode register 310 of FIG. 4.

Referring to FIG. 6A, the memory controller 210, the rank A 110 and the rank B 120 may share the command/address CA signal inputs via the command/address bus 304. In the exemplary embodiment of FIG. 6A, one of the command/address CA signal inputs connected to the command/address bus 304 is illustratively described.

The command/address CA signal provided by the memory controller 210 may be terminated to a supply voltage VDD via the termination resistor Rt on the command/address bus 304. Based on the OP1 setting of "0" of the mode register 310, all of the ranks (for example, the rank A 110 and the rank B 120) sharing the command/address CA signal may be in the un-terminated ODT state. To implement the un-terminated ODT state of the rank A 110 and the rank B 120, the ODT circuit 330 of the memory device 130 of the target rank 110 may be turned off in response to the first control signal CNTL1, and the ODT circuit 330 of the memory device 130 of the non-target rank 120 may also be turned off in response to the first control signal CNTL1.

In FIG. 6A, it may be understood that since the ODT circuit 330 of the target rank 110 and the ODT circuit 330 of the non-target rank 120 are off, the command/address CA signal on the command/address bus 304 is terminated to a level of the power supply voltage VDD. The command/address CA signal at the level of the power supply voltage VDD may be provided to the input buffer 350 of the target rank 110.

Referring to FIGS. 6B and 6C, the command/address CA signal provided by the memory controller 210 may be terminated to the supply voltage VDD via the termination resistor Rt on the command/address bus 304. Based on the OP1 setting of "1" of the mode register 310, any one of the ranks (for example, the rank A 110 and the rank B 120) sharing the command/address CA signal may be in the terminated ODT state.

In FIG. 6B, to implement that any one of the ranks (for example, the rank A 110 and the rank B 120) is in the terminated ODT state, the ODT circuit 330 of the memory device 130 of the target rank 110 may be turned on in response to the first control signal CNTL1, and the ODT circuit 330 of the memory device 130 of the non-target rank 120 may be turned off in response to the first control signal CNTL1.

In FIG. 6C, to implement that any one of the ranks (for example, the rank A 110 and the rank B 120) is in the terminated ODT state, the ODT circuit 330 of the memory device 130 of the target rank 110 may be turned off in response to the first control signal CNTL1, and the ODT circuit 330 of the memory device 130 of the non-target rank 120 may be turned on in response to the first control signal CNTL1.

Referring to FIGS. 6B and 6C, it may be understood that the command/address CA signal on the command/address bus 304 is terminated at a voltage level of VDD/2, which corresponds to half of the power supply voltage VDD. The command/address CA signal at the voltage level of VDD/2 corresponding to half of the power supply voltage VDD may be provided to the input buffer 350 of the target rank 110.

FIGS. 7A through 7D are circuit diagrams illustrating the voltage generation circuit 340 of the memory device 130 in FIG. 3 according to exemplary embodiments, respectively.

Figure 7A:
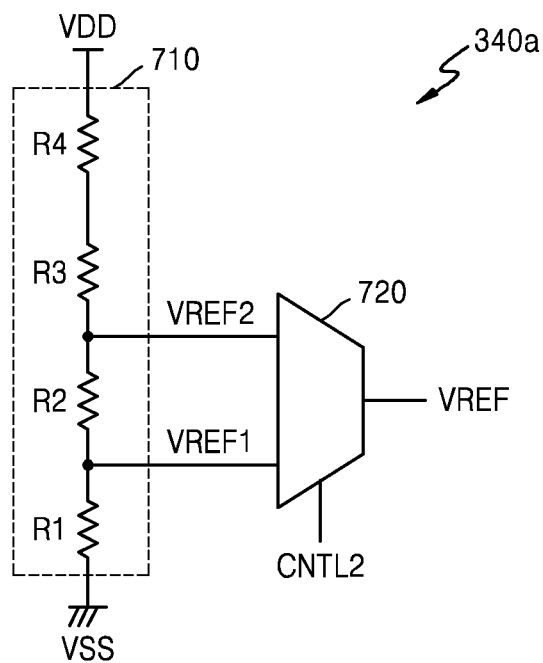
FIGS. 7A through 7D are circuit diagrams illustrating a voltage generation circuit of a memory device in FIG. 3 according to exemplary embodiments, respectively.

Referring to FIG. 7A, a voltage generation circuit 340a may include a voltage distributor 710 (also referred to as a voltage distributor circuit) and a selector 720 (also referred to as a selector circuit). The voltage distributor 710 may include first through fourth resistors R1 through R4 connected in series between the power supply voltage VDD and the ground voltage VSS. Voltages at both ends of the second resistor R2 may be output to the selector 720 as first and second reference voltages VREF1 and VREF2. When the first through fourth resistors R1 through R4 have the same resistance value, the first and second reference voltages VREF1 and VREF2 may each have a voltage level of VDD/4 or VDD/2. The selector 720 may, in response to the second control signal CNTRL2 provided by the control circuit 320, select one of the first and second reference voltages VREF1 and VREF2 output from the voltage distributor 710, and output the selected reference voltage VREF1 or VREF2 as the reference voltage VREF.

Figure 7B:
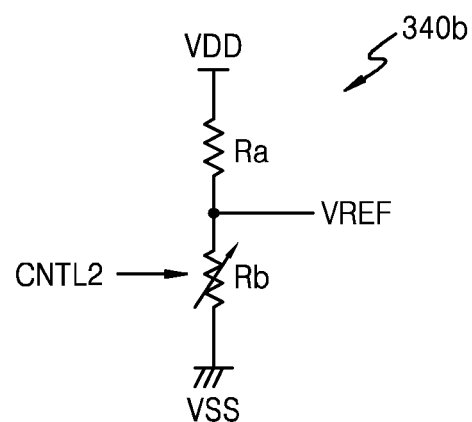

Referring to FIG. 7B, a voltage generation circuit 340b may include a first resistor Ra and a second resistor Rb, which are connected in series between the power supply voltage VDD and the ground voltage VSS, and output the reference voltage VREF to a node between the first resistor Ra and the second resistor Rb. A resistance value of the second resistor Rb may vary according to the second control signal CNTL2 provided by the control circuit 320. The voltage generation circuit 340b may, based on the first and second resistors Ra and Rb, output the reference voltage VREF having the voltage level of VDD/4 or VDD/2, which is distributed from the power supply voltage VDD.

Figure 7C:
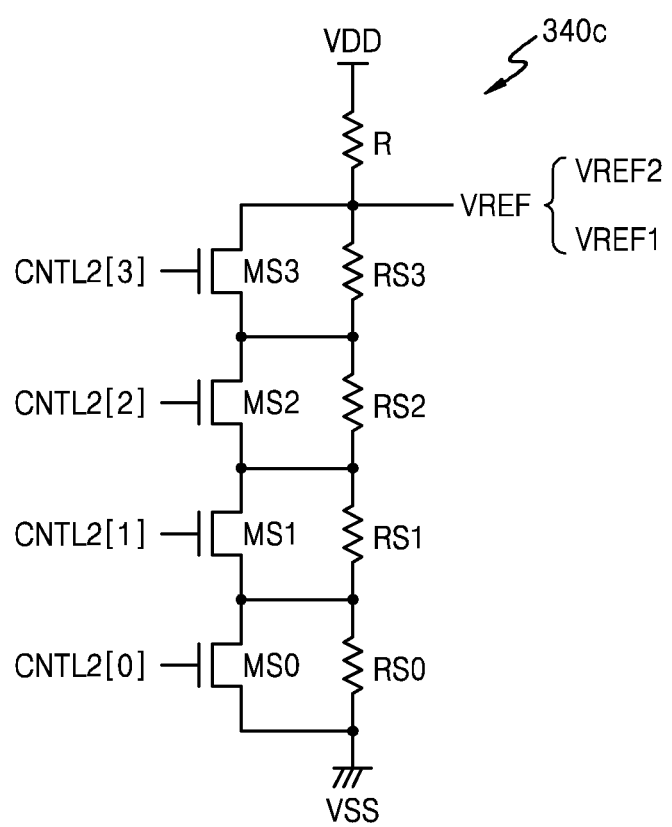

Referring to FIG. 7C, a voltage generation circuit 340c may include a resistor R and resistors RS0 through RS3 connected in series between the power supply voltage VDD and the ground voltage VSS, and transistors MS0 through MS3 connected between each of the resistors RS0 through RS3. Voltages corresponding to second control signal codes CNTL2[0] through CNTL2[3] provided as bit information by the control circuit 320 may be respectively applied to gates of the transistors MS0 through MS3. The voltage generation circuit 340c may output the reference voltage VREF having the voltage level of VDD/4 or VDD/2, which is distributed from the power supply voltage VDD by the resistors RS0 through RS3 which are shorted according to the second control signal codes CNTL2[0] through CNTL2[3].

Figure 7D:
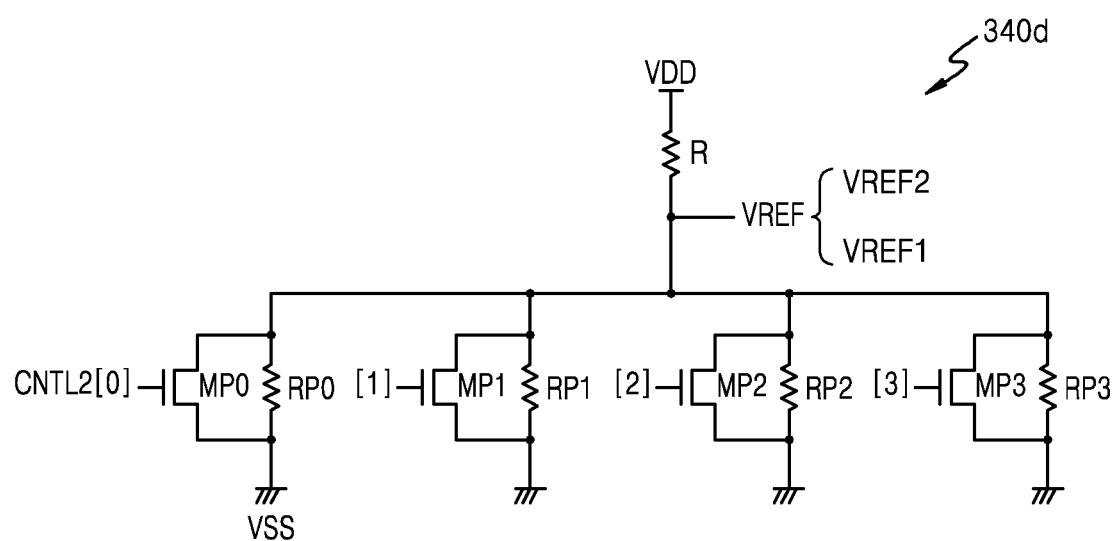

Referring to FIG. 7D, a voltage generation circuit 340d may include the resistor R connected to the power supply voltage VDD, resistors RP0 through RP3 connected in parallel between the resistor R and the ground voltage VSS, and transistors MP0 through MP3 connected respectively to both ends of the resistors RP0 through RP3. Voltages corresponding to the second control signal codes CNTL2[0] through CNTL2[3] provided by the control circuit 320 may be respectively applied to gates of the transistors MP0 through MP3. The voltage generation circuit 340d may output the reference voltage VREF having the voltage level of VDD/4 or VDD/2, which is distributed from the power supply voltage VDD by the resistors RP0 through RP3 which are shorted according to the second control signal codes CNTL2[0] through CNTL2[3].

Figure 8A:
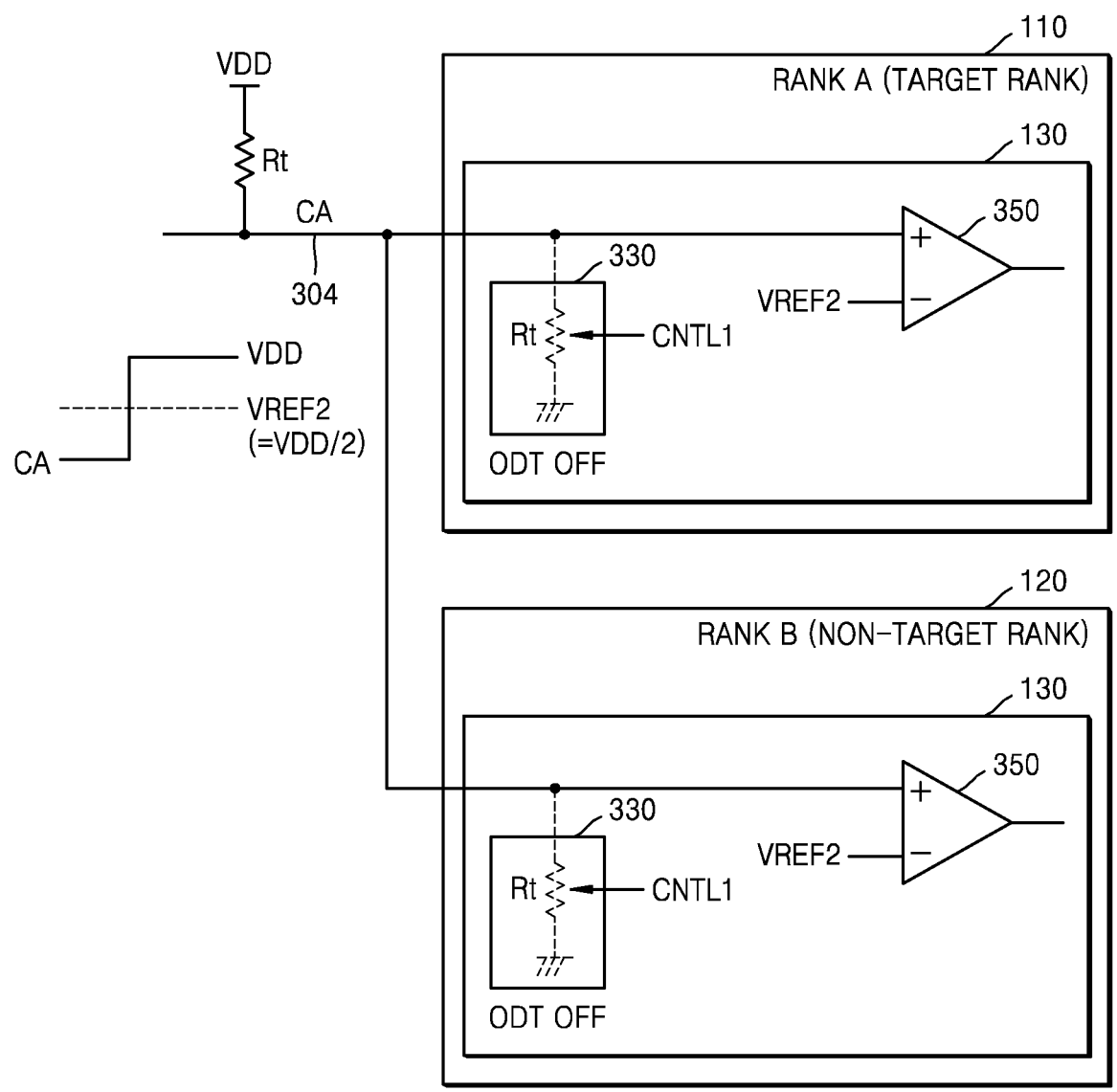
FIGS. 8A through 8C are diagrams illustrating reference voltages provided to input buffers of a memory device of FIG. 3, respectively.
Figure 8B:
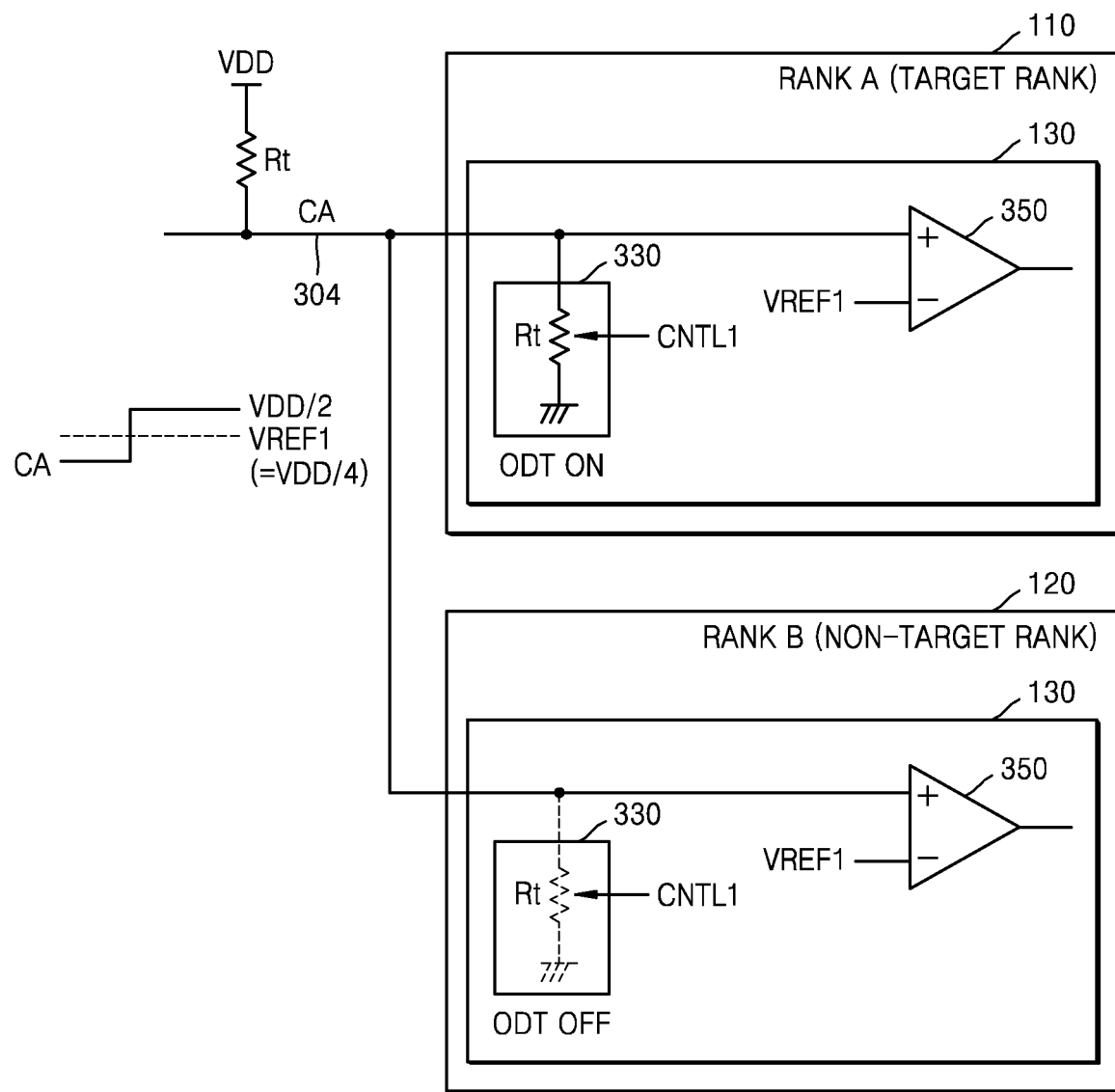
Figure 8C:
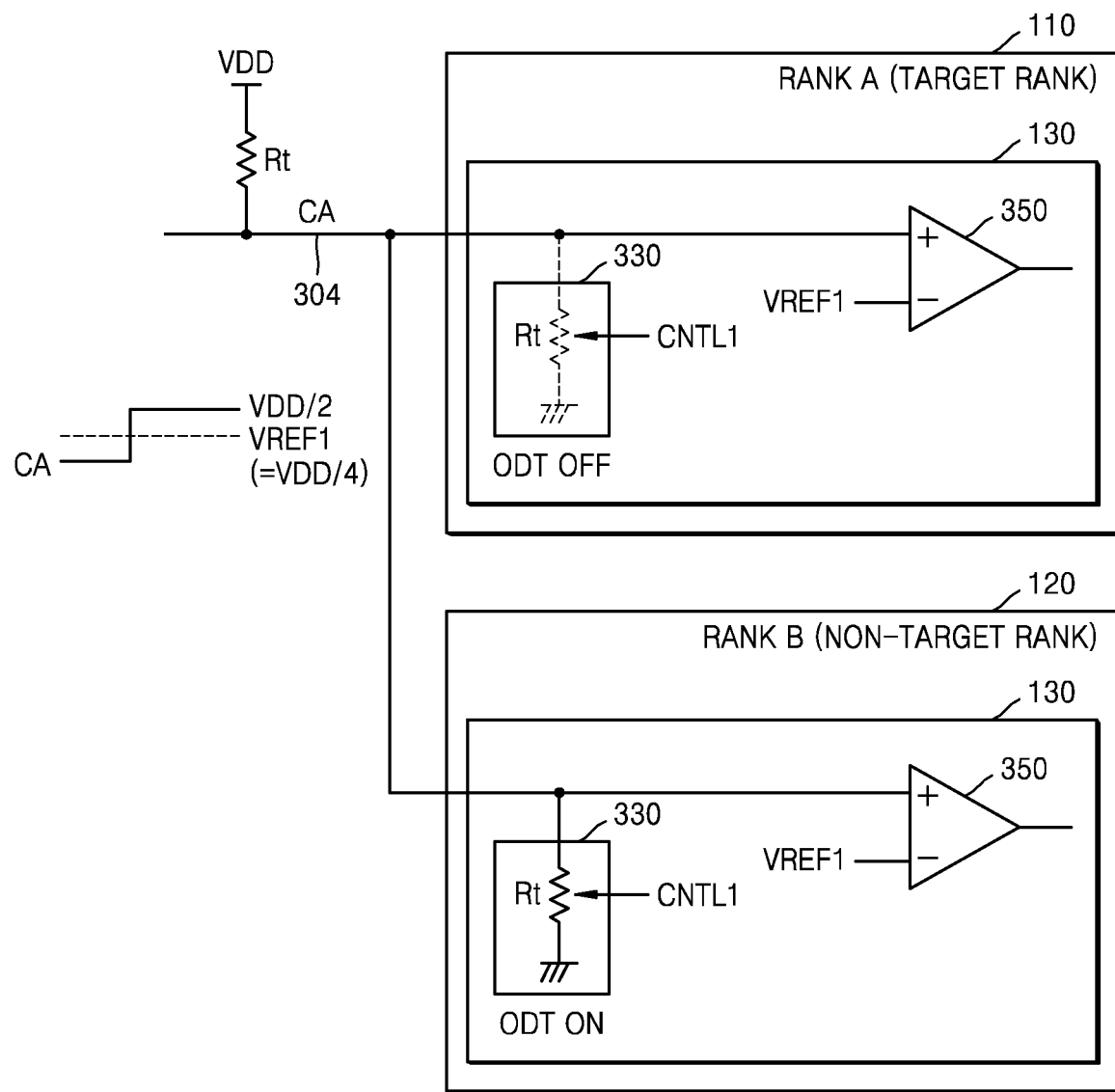

FIGS. 8A through 8C are diagrams illustrating the reference voltage VREF provided to the input buffer 350 of the memory device 130 in FIG. 3, respectively. FIGS. 8A through 8C illustrate the levels of the reference voltages VREF provided to the input buffer 350 in conjunction with the operation of the ODT circuit 330 of the memory device 130 described in FIGS. 6A through 6C, respectively.

Referring to FIG. 8A in conjunction with FIG. 6A, since all of the ranks (for example, the rank A 110 and the rank B 120) sharing the command/address CA signal are in the un-terminated ODT state based on the OP1 setting of "0" of the mode register 310 of FIG. 5, the command/address CA signal on the command/address bus 304 may be terminated to the level of the power supply voltage VDD since the ODT circuit 330 of the target rank 110 and the ODT circuit 330 of the non-target rank 120 are turned off.

The input buffer 350 may receive signals applied at a first input terminal (+) and a second input terminal (−). For example, the command/address CA signal may be applied to the first input terminal (+) of the input buffer 350, and the second reference voltage VREF2 may be applied to the second input terminal (−) of the input buffer 350. The input buffer 350 may sense a logic level of the command/address CA signal based on the second reference voltage VREF2. The sensed logic level of the command/address CA signal may be transmitted to a command decoder and/or address decoder inside the memory device 130.

In FIG. 8A, a level of the second reference voltage VREF2 provided to the input buffer 350 may be provided at the voltage level of VDD/2, which corresponds to half of the power supply voltage VDD. As a result, a sufficient sensing margin may be secured for sensing the command/address CA signal that has been terminated at the level of the power supply voltage VDD.

Referring to FIG. 8B in conjunction with FIG. 6B, since any one of the ranks (for example, the rank A 110 and the rank B 120) sharing the command/address CA signal are in the terminated ODT state based on the OP1 setting of "1" of the mode register 310 of FIG. 5, the command/address CA signal on the command/address bus 304 may be terminated to the voltage level of VDD/2, which corresponds to half of the power supply voltage VDD, since the ODT circuit 330 of the target rank 110 is turned on and the ODT circuit 330 of the non-target rank 120 is turned off.

The input buffer 350 may receive the command/address CA signal at the first input terminal (+) and the first reference voltage VREF1 at the second input terminal (−). The input buffer 350 may sense the logic level of the command/address CA signal based on the first reference voltage VREF1. The sensed logic level of the command/address CA signal may be transmitted to the command decoder and/or address decoder inside the memory device 130.

Referring to FIG. 8C in conjunction with FIG. 6C, since any one of the ranks (for example, the rank A 110 and the rank B 120) sharing the command/address CA signal are in the terminated ODT state based on the OP1 setting of "1" of the mode register 310 of FIG. 5, the command/address CA signal on the command/address bus 304 may be terminated to the voltage level of VDD/2, which corresponds to half of the power supply voltage VDD, since the ODT circuit 330 of the target rank 110 is turned off and the ODT circuit 330 of the non-target rank 120 is turned on.

The input buffer 350 may receive the command/address CA signal at the first input terminal (+) and the first reference voltage VREF1 at the second input terminal (−). The input buffer 350 may sense the logic level of the command/address CA signal based on the first reference voltage VREF1. The logic level of the sensed command/address CA signal may be transmitted to the command decoder and/or address decoder inside the memory device 130.

In FIGS. 8B and 8C, the level of the first reference voltage VREF1 provided to the input buffer 350 may be provided at the voltage level of VDD/4, which corresponds to ¼ of the power supply voltage VDD. Accordingly, a sufficient sensing margin may be ensured for sensing the command/address CA signal terminated at the voltage level of VDD/2 corresponding to a half of the power supply voltage VDD.

Figure 9:
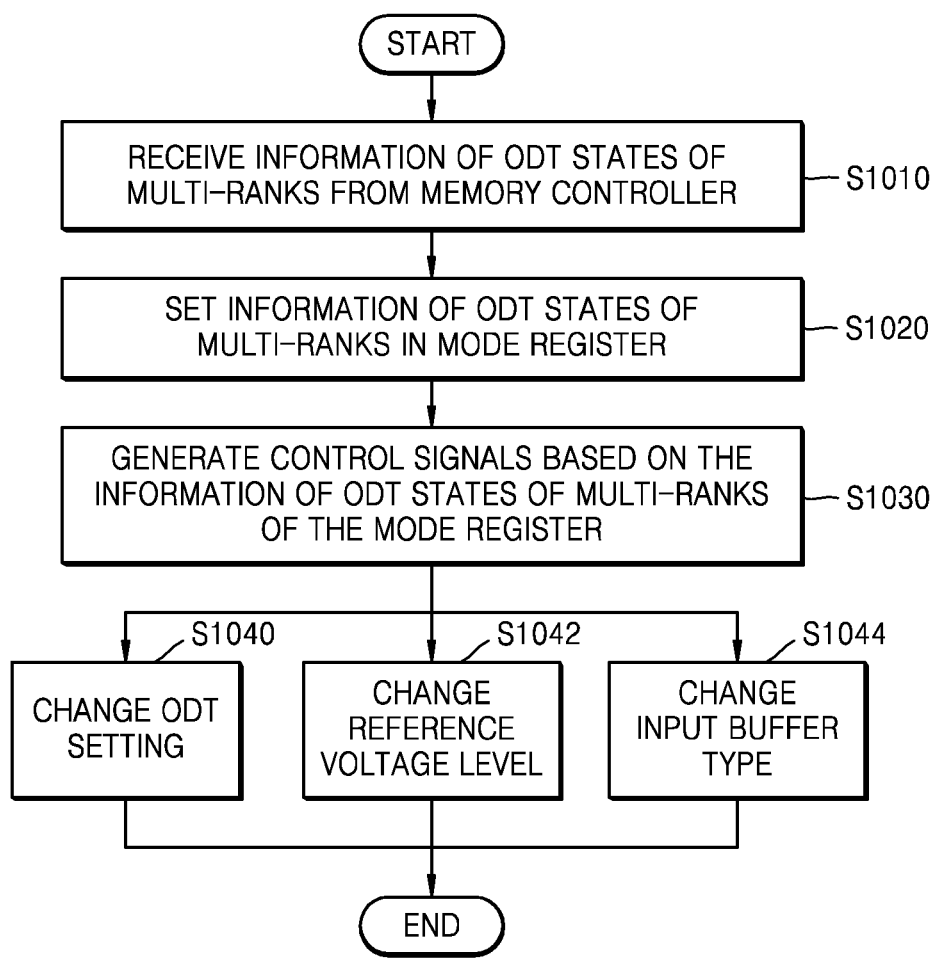
FIG. 9 is a flowchart of a method of operating a memory device in FIG. 3.

FIG. 9 is a flowchart of a method of operating the memory device 130 in FIG. 3.

Referring to FIG. 9, the memory device 130 may be one of the memory devices 130 constituting the rank A 110 and the rank B 120 sharing the signal lines described above. The memory device 130 may receive the ODT state information of the signal lines shared by the rank A 110 and the rank B 120 from the memory controller 210 (S1010).

The memory device 130 may store the ODT state information of the signal lines in the rank A 110 and the rank B 120 in the mode register 310 (S1020). For example, the memory device 130 may store, as the logic of "0" in the OP0 register of the mode register 310 of FIG. 4, the ODT state information indicating that all of the ranks (for example, the rank A 110 and the rank B 120) sharing the clock signal pair (CK and CKB) are in the un-terminated ODT state. Further, the memory device 130 may store, as the logic of "1" in the OP0 register of the mode register 310 of FIG. 4, the ODT state information indicating that any one of the ranks (for example, the rank A 110 and the rank B 120) sharing the clock signal pair (CK and CKB) are in the terminated ODT state.

The memory device 130 may store, as the logic of "0" in the OP1 register of the mode register 310 of FIG. 5, the ODT state information indicating that all of the ranks (for example, the rank A 110 and the rank B 120) sharing the command/address CA signal inputs are in the un-terminated ODT state. Further, the memory device 130 may store, as the logic of "1" in the OP1 register of the mode register 310 of FIG. 5, the ODT state information indicating that any one of the ranks (for example, the rank A 110 and the rank B 120) sharing the command/address CA signal inputs are in the terminated ODT state.

The memory device 130 may generate the first through third control signals CNTL1 through CNTL3 based on the ODT state information of the signal line stored in the mode register 310 (S1030).

The memory device 130 may change the ODT setting inside the memory device 130 connected to the signal line in response to the first control signal CNTL1 (S1040). The memory device 130 may selectively turn on/off the ODT circuit 330 in response to the first control signal CNTL1.

Based on the OP0 setting of "0" of the mode register 310 of FIG. 4, the ODT circuit 330 of the memory device 130 of the target rank 110 connected to the clock CK signal on the clock signal line 302, and the ODT circuit 330 of the memory device 130 of the non-target rank 120 may be turned off. Based on the OP0 setting of "1" of the mode register 310 of FIG. 4, the ODT circuit 330 of the memory device 130 of the target rank 110 connected to the clock CK signal on the clock signal line 302 may be turned on and the ODT circuit 330 of the memory device 130 of the non-target rank 120 may be turned off. Alternatively, based on the OP0 setting of "1" of the mode register 310 of FIG. 4, the ODT circuit 330 of the memory device 130 of the target rank 110 connected to the clock CK signal on the clock signal line 302 may be turned off and the ODT circuit 330 of the memory device 130 of the non-target rank 120 may be turned on.

Based on the OP1 setting of "0" of the mode register 310 of FIG. 5, the ODT circuit 330 of the memory device 130 of the target rank 110 connected to the command/address CA signal on the command/address bus 304, and the ODT circuit 330 of the memory device 130 of the non-target rank 120 may be turned off. Based on the OP1 setting of "1" of the mode register 310 of FIG. 5, the ODT circuit 330 of the memory device 130 of the target rank 110 connected to the command/address CA signal on the command/address bus 304 may be turned on and the ODT circuit 330 of the memory device 130 of the non-target rank 120 may be turned off. Alternatively, based on the OP1 setting of "1" of the mode register 310 of FIG. 5, the ODT circuit 330 of the memory device 130 of the target rank 110 connected to the command/address CA signal on the command/address bus 304 may be turned off and the ODT circuit 330 of the memory device 130 of the non-target rank 120 may be turned on.

The memory device 130 may change the level of the reference voltage VREF provided to the input buffer 350 connected to the signal line in response to the second control signal CNTL2 (S1042). The memory device 130 may use the voltage generation circuit 340*d* in response to the second control signal CNTL2 to output the first reference voltage VREF1 or the second reference voltage VREF2, which has the voltage level of VDD/4 or VDD/2 distributed from the power supply voltage VDD. The first reference voltage VREF1 or the second reference voltage VREF2 may be provided to the input buffer 350.

The memory device 130 may change the type of the input buffer 350 connected to the signal line in response to the second control signal CNTL2 (S1044).

Figure 10:
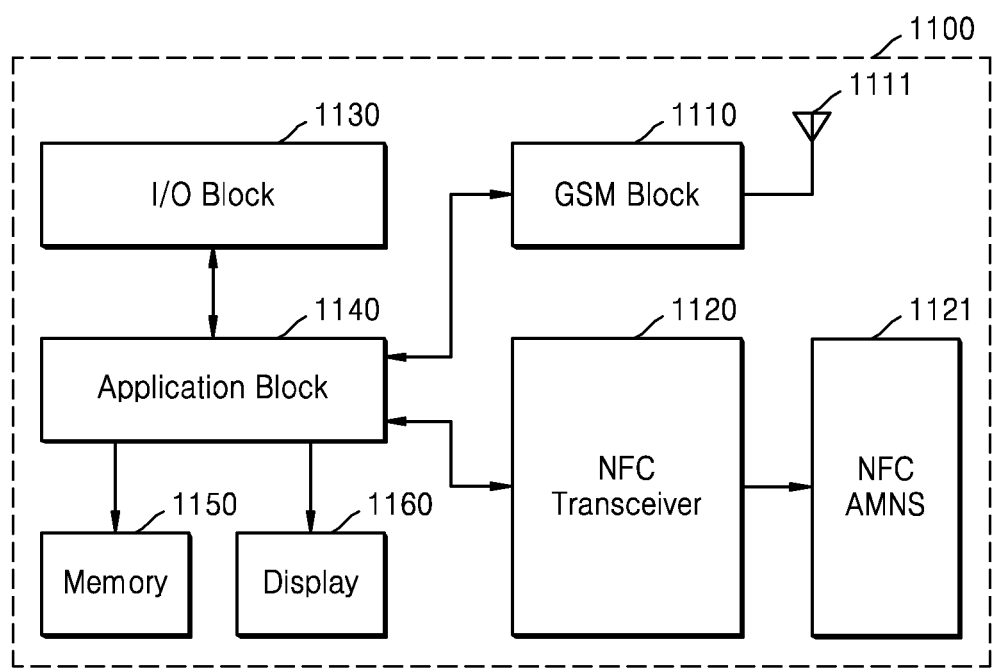
FIG. 10 is a block diagram illustrating an example of a mobile device to which a memory system is applied, according to an exemplary embodiment.

FIG. 10 is a block diagram illustrating an example of a mobile device 1100 to which a memory system is applied, according to an exemplary embodiment. The mobile device 1100 may be, for example, a mobile phone, a smartphone, a computing tablet, a wireless enabled e-reader, a wearable computing device, etc.

Referring to FIG. 10, the mobile device 1100 may include a global system for mobile communication (GSM) block 1110, a near field communication (NFC) transceiver 1120, an input/output (I/O) block 1130, an application block 1140, a memory 1150, and a display 1160. In FIG. 10, the components/blocks of the mobile device 1100 are illustratively shown. The mobile device 1100 may include more or fewer components/blocks than those shown in FIG. 10.

In addition, even though the exemplary embodiment of FIG. 10 is shown as using GSM technology, exemplary embodiments are not limited thereto. For example, the mobile device 1100 may be implemented by using other technologies such as code division multiple access (CDMA)

in exemplary embodiments. The blocks in FIG. 10 may be implemented, for example, as integrated circuits. Alternatively, some of the blocks may be implemented as integrated circuits, while other blocks may be implemented in separate types.

The GSM block 1110 may be connected to an antenna 1111 to provide wireless communications. The GSM block 1110 may internally include a receiver and a transmitter to perform corresponding receiving and transmitting operations.

The NFC transceiver 1120 may be configured to transmit and receive NFC signals by using inductive coupling for wireless communication. The wireless communication may include, for example, a personal area network such as BLUETOOTH, a local area network such as WiFi and/or a wide area network such as worldwide interoperability for microwave access (WiMAX), or other wireless communication. The NFC transceiver 1120 may provide NFC signals to an NFC antenna matching network system (AMNS) 1121, and the NFC AMNS 1121 may transmit NFC signals through the inductive coupling. The NFC AMNS 1121 may receive NFC signals provided from other NFC devices and provide the received NFC signals to the NFC transceiver 1120.

The application block 1140 may include hardware circuits, for example, one or more processors, and provide various user applications provided by the mobile device 1100. The user applications may include, for example, voice call operations, data transmission, data swapping, etc. The application block 1140 may operate in conjunction with the GSM block 1110 and/or the NFC transceiver 1120 to provide operating characteristics of the GSM block 1110 and/or the NFC transceiver 1120. Alternatively, the application block 1140 may include a program for point of sales (POS). For example, the program may provide a credit card purchase and payment function using a mobile phone or a smartphone.

The display 1160 may display an image in response to display signals received from the application block 1140. The image may be provided by the application block 1140 or generated by a camera embedded in the mobile device 1100. The display 1160 may include a frame buffer for temporary storing pixel values, and a liquid crystal display screen together with associated control circuits.

The I/O block 1130 may provide an input function to a user and provide outputs to be received via the application block 1140. The I/O block 1130 may represent hardware devices and software components associated with an interaction with the user. The I/O block 1130 may operate to manage some hardware of the display 1160 and/or an audio system. For example, an input via a microphone or an audio device may be provided to the application block 1140. When the display 1160 includes a touch screen, the display 1160 may function as an input device that is managed partially by the I/O block 1130. To provide an I/O function managed by the I/O block 1130, additional buttons or switches may be included in the mobile device 1100. The I/O block 1130 may manage devices such as, for example, an accelerometer, a camera, an optical sensor or other environmental sensor, a gyroscope, or other hardware that is included in a global positioning system (GPS) of the mobile device 1100.

The memory 1150 may store programs (instructions) and/or data to be used by the application block 1140, and may be implemented as, for example, random-access memory (RAM), read-only memory (ROM), a flash memory, etc. Accordingly, the memory 1150 may include nonvolatile storage elements as well as volatile storage elements. For example, the memory 1150 may include the memory system 10 described in FIGS. 1 through 10.

The memory 1150 may include a memory controller and a multi-rank memory device sharing a signal line(s). The memory controller may determine whether the signal line shared by the multi-ranks is to be operated in in un-terminated ODT state, and may determine which signal line of a rank is to be operated in a terminated ODT state based on the target rank. The memory controller may, according to a result of the determination, broadcast ODT state information of the signal line shared by the multi-ranks to all of the memory devices of the multi-ranks. The multi-rank memory device may receive the ODT state information of the shared signal line that is broadcast from the memory controller in each of the multi-rank memory devices, and may store the ODT state information in a mode register. Each of the multi-rank memory devices may, based on the ODT state information of the signal line stored in the mode register, change an ODT setting inside the memory device connected to the signal line, change a level of a reference voltage provided to an input buffer connected to the signal line, or change a type of an input buffer connected to the signal line.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to the exemplary embodiments thereof, it will be understood by one of ordinary skill in the art that various changes in form and detail may be made therein without departing from the spirit and scope of the inventive concept as defined by the following claims.

What is claimed is:

1. A method of operating memory devices of a multi-rank memory device, the method comprising:
   receiving a first on-die termination (ODT) state information of a clock signal line shared by memory ranks of the multi-rank memory device and a second ODT state information of a command/address (CA) signal line shared by the memory ranks, each memory rank including a plurality of memory devices;
   storing the first and second ODT state information in first and second mode registers of each of the memory devices; and
   selecting a first reference voltage and a second reference voltage in response to the stored first and second ODT state information in each memory device, the first reference voltage being used for determining a logic level of a clock signal received through the clock signal line, and the second reference voltage being used for determining a logic level of a command/address (CA) signal received through the CA signal line respectively, wherein a first level of the first reference voltage is different from a second level of the second reference voltage when the first ODT state information and the second ODT state information are different from each other.

2. The method of claim 1, wherein the first ODT state information indicates one of an ODT enabled state and an ODT disabled state of the clock signal line and the second ODT state information indicates one of an ODT enabled state and an ODT disabled state of the CA signal line.

3. The method of claim 2, wherein, during the ODT enabled state of the clock signal line, the clock signal line shared by the memory ranks is terminated in at least one of the memory ranks, and during the ODT disabled state of the clock signal line, the clock signal line is unterminated in all of the memory ranks.

4. The method of claim 3, wherein, during the ODT enabled state of the CA signal line, the CA signal line shared by the memory ranks is terminated in at least one of the memory ranks, and during the ODT disabled state of the CA signal line, the CA signal line is unterminated in all of the memory ranks.

5. The method of claim 4, wherein each of the first and second reference voltages has a fixed value when a corresponding one of the first and second ODT state information indicates the ODT disabled state.

6. The method of claim 5, wherein each of the first and second reference voltages has a half level of a power supply voltage when a corresponding one of the first and second ODT state information indicates the ODT disabled state.

7. The method of claim 6, wherein each of the first and second reference voltages has a voltage level which is higher than a ground voltage and lower than half of the power supply voltage when a corresponding one of the first and second ODT state information indicates the ODT enabled state and a corresponding enabled ODT circuit is terminated to the ground voltage.

8. The method of claim 1, further comprising:
changing a type of input buffers of the memory devices coupled to the clock signal line and the CA signal line in accordance with the first and second ODT state information.

9. The method of claim 8, wherein one of the first reference voltage and the second reference voltage is applied to a corresponding type of input buffers in accordance with the first and second ODT state information.

10. The method of claim 1, further comprising:
generating, in each of the memory devices of the multi-rank memory device, a first control signal based on the first ODT state information of the clock signal line stored in the first mode register and a second control signal based on the second ODT state information of the CA signal line stored in the second mode register, wherein the first and second control signals are used for selecting one of the first and second reference voltages.

11. The method of claim 1, further comprising:
performing a mode register programming operation for storing the first and second ODT state information in the respective first and second mode registers.

12. A multi-rank memory system, comprising:
a multi-rank memory device including at least two memory ranks, each memory rank including a plurality of memory devices and each memory device including mode registers for storing on-die termination (ODT) state information of the multi-rank memory device;
a memory controller programming the ODT state information in mode registers of each memory device;
a clock signal line coupled between the multi-rank memory device and the memory controller and shared by the memory ranks, wherein a first ODT state information with respect to the clock signal line is stored in a first mode register among the mode registers; and
a command/address (CA) signal line coupled between the multi-rank memory device and the memory controller and shared by the memory ranks, wherein a second ODT state information with respect to the CA signal line is stored in a second mode register among the mode registers,
wherein the memory controller programs the first ODT state information in the first mode register and the second ODT state information in the second mode register respectively, the first ODT state information has a first logic value when the clock signal line is terminated in at least one memory rank and has a second logic value when the clock signal line is unterminated in all of the memory ranks, and the second ODT state information has the first logic value when the CA signal line is terminated in at least one memory rank and has a second logic value when the CA signal line is unterminated in all of the memory ranks,
wherein each memory device selects a first reference voltage for determining a logic level of the clock signal received through the clock signal line in response to the first ODT state information stored in the first mode register and selects a second reference voltage for determining a logic level of a command/address (CA) signal received through the CA signal line in response to the second ODT state information stored in the second mode register respectively, and
wherein the first reference voltage is different from the second reference voltage when the first ODT state information and the second ODT state information have different logic values from each other.

13. The multi-rank memory system of claim 12, wherein each of the first and second ODT state information indicates one of an ODT enabled state and an ODT disabled state of a corresponding clock signal line and CA signal line, and during the ODT enabled state of the clock signal line, the clock signal line shared by the memory ranks is terminated in at least one of the memory ranks, and during the ODT disabled state of the clock signal line, the clock signal line is unterminated in all of the memory ranks.

14. The multi-rank memory system of claim 13, wherein, during the ODT enabled state of the CA signal line, the CA signal line shared by the memory ranks is terminated in at least one of the memory ranks, and during the ODT disabled state of the CA signal line, the CA signal line is unterminated in all of the memory ranks.

15. The multi-rank memory system of claim 14, wherein each of the first and second reference voltages has a fixed value when a corresponding one of the first and second ODT state information indicates the ODT disabled state.

16. The multi-rank memory system of claim 15, wherein each of the first and second reference voltages has a half level of a power supply voltage when a corresponding one of the first and second ODT state information indicates the ODT disabled state.

17. The multi-rank memory system of claim 16, wherein each of the first and second reference voltages has a voltage level which is higher than a ground voltage and lower than half of the power supply voltage when a corresponding one of the first and second ODT state information indicates the ODT enabled state and a corresponding enabled ODT circuit is terminated to the ground voltage.

18. The multi-rank memory system of claim 12, wherein each of the memory devices changes a type of input buffer of the memory devices used for receiving one of the clock signal and the CA signal in accordance with the first and second ODT state information.

19. The multi-rank memory system of claim 18, wherein the first reference voltage and the second reference voltage are applied to a corresponding type of input buffer in accordance with the first and second ODT state information.

20. The multi-rank memory system of claim 12, wherein each of the memory devices of the multi-rank memory device includes a control signal generator which generates a first control signal based on the first ODT state information of the clock signal line stored in the first mode register and a second control signal based on the second ODT state information of the CA signal line stored in the second mode register, and the first and second control signals are used for selecting one of the first and second reference voltages.

* * * * *